United States Patent [19]

Sado et al.

[11] 4,433,887

[45] Feb. 28, 1984

[54] ADJUSTABLE AND READILY SOLDERABLE SHEET-LIKE CONNECTORS

[75] Inventors: Ryoichi Sado; Kazutoki Tahara, both of Saitama, Japan

[73] Assignee: Shin-Etsu Polymer Co., Ltd., Tokyo, Japan

[21] Appl. No.: 432,063

[22] Filed: Sep. 30, 1982

Related U.S. Application Data

[63] Continuation-in-part of Ser. No. 189,326, Sep. 22, 1980, abandoned.

[30] Foreign Application Priority Data

Oct. 4, 1979 [JP] Japan .................. 54-137749

[51] Int. Cl.³ ............................................. H01R 7/02
[52] U.S. Cl. .................. 339/17 R; 339/275 B; 174/88 R
[58] Field of Search .............. 339/17 R, 17 A, 17 B, 339/17 F, 59 R, 59 M, 275 R, 275 B, DIG. 1, DIG. 3; 174/117 F, 117 FF, 117 PC, 72 C, 88 R, 94 R, 68.5

[56] References Cited

U.S. PATENT DOCUMENTS

| | | | |
|---|---|---|---|
| 2,427,144 | 9/1947 | Jansen | 339/17 B |
| 2,703,854 | 3/1955 | Eisler | 339/17 F |
| 3,622,687 | 11/1971 | Doughty | 339/17 F |
| 3,659,247 | 4/1972 | Chaney et al. | 174/72 C |
| 3,677,085 | 7/1972 | Hayakawa | 174/117 F |
| 3,851,296 | 11/1974 | Muchmore et al. | 339/DIG. 1 |
| 4,113,981 | 9/1978 | Fujita et al. | 174/94 R |

FOREIGN PATENT DOCUMENTS

2307436  11/1976  France ............... 339/17 R

Primary Examiner—Joseph H. McGlynn
Attorney, Agent, or Firm—Hopgood, Calimafde, Kalil, Blaustein & Judlowe

[57] ABSTRACT

The adjustable and readily solderable sheet-like connector of the invention is composed of an insulating sheet-like elastic body, a plurality of parallel-running wires of a soft and plastically deformable metal or alloy integrally bonded to the surface of the sheet-like body forming an array of parallel electroconductive paths and a soldering layer at least partly covering the exposed array of the metal wires as formed of a composite material composed of a plastically flowable material such as a hot-melt adhesive and particles or chopped fibers of a solder alloy dispersed therein. The connector is easily bent and left in the bent form just like an adjustable ruler to comply with any curved surface of a printed circuit board and readily bonded to the printed circuit board by heating and pressing between hot plates to cause melting of and soldering with the particles or chopped fibers of the solder alloy contained in the soldering layer at the portions just between each set of the metal wires and the connecting terminals on the printed circuit board due to the better heat conduction there than in the other portions at which the soldering layer is left electrically insulating.

9 Claims, 8 Drawing Figures

ADJUSTABLE AND READILY SOLDERABLE SHEET-LIKE CONNECTORS

BACKGROUND OF THE INVENTION

This is a continuation-in-part application from a parent U.S. application Ser. No. 189,326 filed Sept. 22, 1980, now abandoned.

The present invention relates to a novel sheet-like connector used for electrically connecting two electronic circuit boards or, more particularly, to an adjustable and readily solderable sheet-like connector capable of being deformed to be imparted with a desired bent form most suitable for connecting two particular circuit boards as sandwiched therebetween at the contacting terminal portions thereof with reliable bonding by soldering in a high working efficiency.

Sheet-like connectors have a structure that a set of electroconductive paths running substantially in parallel with each other are provided on a sheet of an electrically insulating material such as a plastic or rubber sheet. The electroconductive paths of such a striped pattern are formed, for example, by printing with an electroconductive ink or paint on the surface of the insulating sheet. It is of course that printing with an ink or paint modifies or influences the mechanical properties of the insulating sheet only very slightly so that the connectors obtained also have mechanical properties not so widely different from the unprinted insulating sheet per se. Therefore, the sheet-like connectors of the prior art are more or less elastically resilient depending on the elastic properties of the insulating sheet base.

Such elastically resilient sheet-like connectors are of course useful for some applications but subject to serious inconveniences in other applications, for example, due to the incapability of complying with delicately curved surfaces so that the working efficiency of assembling electronic instruments including one or more of such sheet-like connectors built therein is sometimes greatly reduced.

Furthermore, it is sometimes desirable that the electroconductive paths on the connector and the contacting terminals on the circuit board are bonded by soldering to ensure good electric connection therebetween instead of being electrically connected by mere contacting under pressure by use of a suitable clamping means. The soldering work to make electric connection therebetween is extremely cumbersome and time-consuming because the conductive paths on the connector and each of the contacting terminals provided on the circuit board in a large number are usually very fine or small and they must be soldered point by point even though certain improvement in the working efficiency may be obtained by the robotization of the working process.

SUMMARY OF THE INVENTION

It is an object of the present invention to provide a novel and improved sheet-like connector capable of being adjusted to comply with any delicately curved surface as plastically deformed with very small deforming forces to be freed from the above mentioned inconvenience in the prior art sheet-like connectors.

Another object of the invention is to provide a sheet-like adjustable connector which can readily be bonded to the contacting terminals of a circuit board by soldering without the very cumbersome process of point-by-point soldering as has been unavoidable in the prior art sheet-like connectors.

Thus, the adjustable and readily solderable sheet-like connector of the present invention comprises:

(a) a sheet-like body made of an electrically insulating elastic material, (b) a plurality of wires of a plastically deformable soft metal or alloy integrally bonded to the sheet-like body in a planar arrangement running substantially in parallel with each other, at least part of the surface of each of the wires being not embedded in the sheet-like body forming a set of parallel electroconductive paths on the surface of the sheet-like body, and (c) a soldering layer of a plastically flowable material at least partly covering the surfaces of the wires at the portions not embedded in the sheet-like body and containing particles of a solder alloy dispersed therein.

DETAILED DESCRIPTION OF THE PREFERRED EMBODIMENTS

In the following, the adjustable and readily solderable sheet-like connector of the invention is described in detail with reference to the accompanying drawing.

Figure 1A:
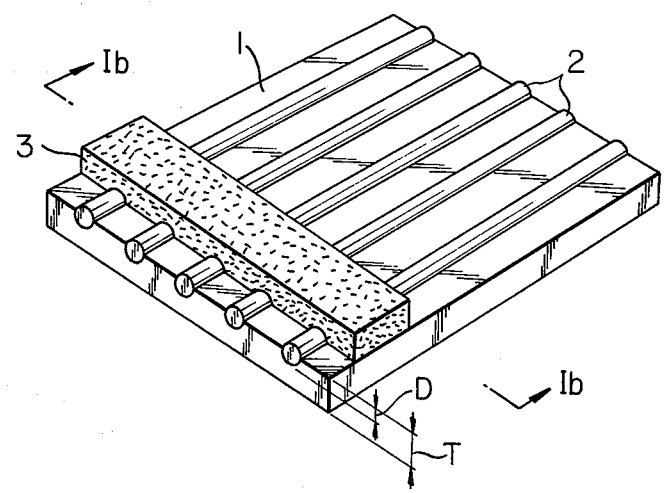
FIG. 1a is a perspective view of an inventive connector and FIG. 1b is a cross sectional view of the connector shown in FIG. 1a as cut and viewed along the line Ib—Ib.
Figure 1B:
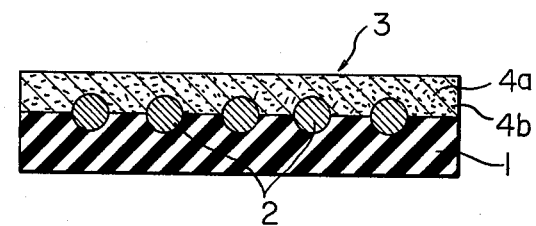

FIGS. 1a and 1b illustrate a typical example of the inventive connector by a perspective view and a cross sectional view, respectively. As is shown in these figures, the sheet-like connector is formed with a sheet-like base body 1 having a thickness of T made of an electrically insulating material with rubbery elasticity and a plurality of wires 2 made of a metal or an alloy with a diameter D extending substantially in parallel with each other as partly embedded in and integrally bonded to the surface of the sheet-like body 1.

The metal wires 2 are each partly embedded in the sheet-like body 1 in a depth of about a half diameter of the wire. It is essential that at least a part of each of the metal wires 2 is not embedded in the sheet-like body 1 but exposed on the surface of the sheet-like body 1 so that the insulating sheet-like body 1 is provided with a set of parallel electroconductive paths on one surface thereof.

The properties of the metal or alloy forming the wires 2 are of importance and the metal wires 2 should be plastically deformable easily with human fingers and can retain their bent form when once they are deformed. This requirement is similar to that for the metal core in an adjustable ruler which can be readily bent by fingers and retain its bent form when once deformed so that the adjustable ruler can comply with or fit any delicately curved lines desired to be drawn by means of the ruler. The most important mechanical property from the standpoint to satisfy the above requirement is the Brinell hardness of the metal or alloy which should desirably be smaller than 100 kg/mm$^2$ or, preferably, smaller than 70 kg/mm$^2$ without brittleness. Furthermore, the metal or alloy should be readily solderable or susceptible to bonding by soldering with a suitable solder alloy. In this respect, several metals and alloys are suitable for the purpose including gold, silver, copper, tin, lead and alloys of these metals such as solder alloys.

As is shown in FIGS. 1a and 1b, the parallel array of the metal wires 2 is covered with a soldering layer 3 at the portion where the metal wires 2 are not embedded in the sheet-like insulating body 1 but exposed on the surface thereof to make the connecting terminals. This soldering layer 3 is made of a composite material composed of a plastically flowable material 4a and particles or chopped fibers of a solder alloy 4b dispersed in the matrix of the former. The density of dispersion of the solder particles or chopped fibers 4a in the matrix of the plastically flowable material 3a should be as high as possible provided that the electric insulation of the resultant composite layer 3 is ensured. The particle size of the powdery solder alloy 4b is preferably in the range from 0.01 to 1 mm in diameter while the chopped fibers should have a diameter in the range from 0.01 to 0.1 mm, the ratio of the length to diameter of each fiber being in the range from 3 to 10, and the thickness of the soldering layer 3 should be at least 0.05 mm.

The plastically flowable material 4a may not be flowable at room temperature but it should be plastically flowable at least at an elevated temperature at which the solder alloy is melted and bonding by soldering is effected. Therefore, the rheological property of the material at room temperature is not particularly limitative provided that the material has a sufficient rigidity to prevent the migration of the solder particles or fibers 4b in the materix 4a including a grease-like or wax-like material and a so-called hot-melt type adhesive which is solid at room temperature but melts when heated at an elevated temperature and solidifies again by cooling. The melting temperature or soldering temperature of the solder particles or chopped fibers 4b dispersed in the plastically flowable material 4a should preferably be substantially lower than the melting point of the metal wires 2 so that melting of the metal wires 2 does not take place in the soldering process described below.

Figure 3A:
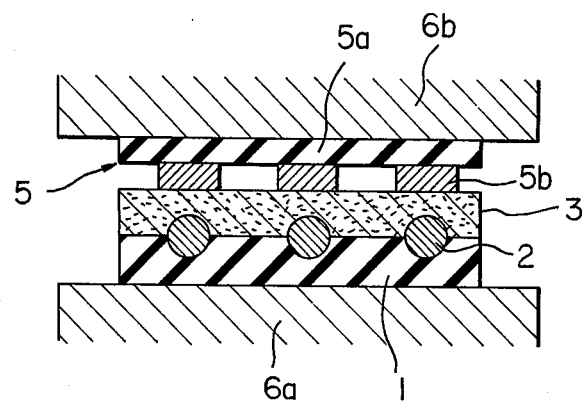
FIGS. 3a and 3b illustrate the process of bonding the inventive connector and a circuit board by soldering under heat and pressure.
Figure 3B:
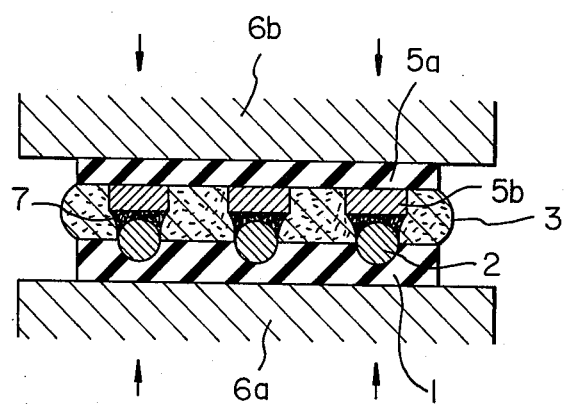

FIGS. 3a and 3b illustrate the principle for bonding the inventive connector with the connecting terminals of a printed circuit board. As is shown in FIG. 3a, the inventive connector composed of the insulating sheet-like board 1, metal wires 2 and soldering layer 3 is overlaid with the printed circuit board 5 having a plurality of the terminals 5b, usually, made of a copper foil on an insulating substrate board 5a in such a manner that each of the connecting terminals 5b is just above one of the metal wires 2 in the connector with the soldering layer 3 in between. In other words, the pitch of the metal wires 2 on the inventive connector should match the pitch of the connecting terminals 5b on the printed circuit board 5.

The connector and the printed circuit board 5 thus laid one on the other are then sandwiched between two hot plates 6a,6b heated at an elevated temperature or between a hot plate and a cold pressure plate under an appropriate pressure as is shown in FIG. 3a so that the heat flows from the hot plates 6a,6b into the soldering layer 3 of the connector through the insulating sheet-like body 1 or through the insulating substrate 5a of the printed circuit board 5. In this case, the soldering layer 3 is heated more strongly at the portions just between each of the metal wires 2 in the connector and each of the terminals 5b on the insulating substrate 5a of the printed circuit board 5 than at the other portions due to the good heat conductivity of the metal wires 3 and the metal-made terminals 5b. Therefore, the particles or chopped fibers of the solder alloy 4b contained in the soldering layer 3 at the portions just between the metal wires 2 in the connector and the terminals 5b of the printed circuit board 5 are melted earlier than the particles or chopped fibers 4b not between them to form a solder bond 7 between each set of the metal wires 2 and the terminals 5b as is shown in FIG. 3b while the particles or chopped fibers of the solder alloy 4b not between the metal wires 2 and the terminals 5b still remain as dispersed in the matrix of the plastically flowable material 4a to maintain the electric insulation between the thus bonded sets of the metal wires 2 and the terminals 5b. The electric connection of the connector and the printed circuit board is completed in this manner very conveniently and with high working efficiency. It is optional that the soldering layer 3 contains a soldering flux or paste to facilitate soldering.

Figure 2A:
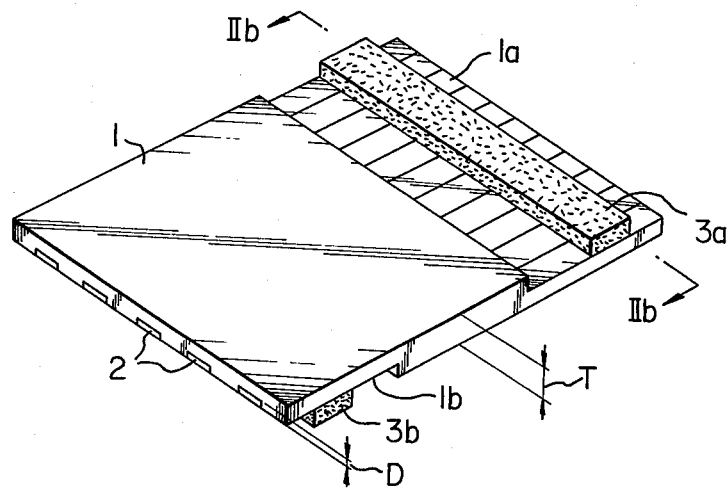
FIG. 2a is a perspective view of another inventive connector dually connectable and FIG. 2b is a cross sectional view of the connector in FIG. 2a as cut and viewed along the line IIb—IIb.
Figure 2B:
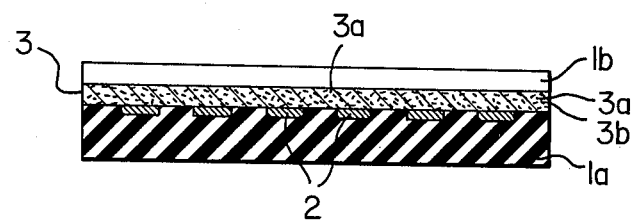

FIGS. 2a and 2b illustrate a dually solderable connector according to the invention by a perspective view and a cross sectional view, respectively. As is shown in FIG. 2a, the sheet-like body 1 made of an electrically insulating elastic material has a configuration with a crank-wise side view and a thickness T at the center portion and the metal wires 2 each having a rectangular cross section with a thickness D appear on the different surface of each of the stepped portions 1a,1b of the sheet-like body 1 facing to the opposite direction to form two arrays of the parallel electroconductive paths. Soldering layers 3a,3b are provided each on one of the parallel arrays of the metal wires 2 appearing on each of the stepped portions 1a,1b of the sheet-like insulating elastic body 1. The inventive connector of this dual type is useful for electrically connecting two printed circuit boards by means of the two soldering layers 3a,3b.

Figure 4:
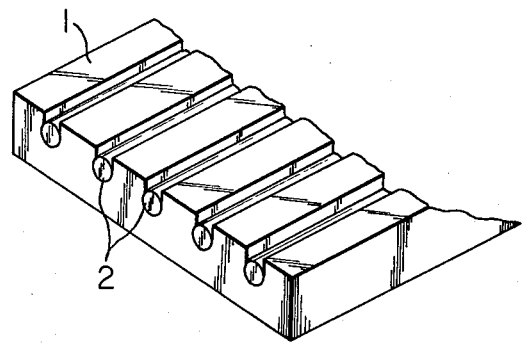
FIGS. 4 and 5 are each a perspective view of a different embodiment of the inventive connector but without the soldering layer.
Figure 5:
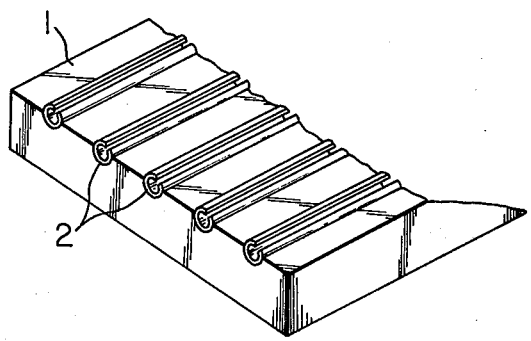

FIGS. 4 and 5 each illustrate a different embodiment of the inventive connector before providing the soldering layer. Different from the embodiment illustrated in FIGS. 1a and 1b in which each of the metal wires 2 is embedded in the sheet-like body 1 only to a depth of a half diameter thereof, each of the metal wires 2 in FIG. 4 is held at the bottom of the deep groove in the sheet-like body 1 to lie below the surface level of the sheet-like body 1. Since the groove is open upwardly, the soldering layer should be provided not only on the sheet-like body 1 but also to fill the grooves in contact with the metal wires 2. It is optional in this case that the soldering composite material composed of the plastically flowable material and the particles or chopped fibers of the solder alloy dispersed therein to form the soldering layer is used only to fill the grooves and the upper surface of the sheet-like body 1 is left uncovered with the soldering layer to give an advantage of considerable saving of the soldering composite material.

FIG. 5 illustrates another embodiment of the inventive connector in which each of the metal wires 2 is not solid to the core but has a C-wise cross section opening upwardly. The soldering layer 3 is provided in just the same way as in FIGS. 1a and 1b but it is essential in this case that the hollow spaces of the metal wires 2 of the C-wise creoss section should be filled with the soldering composite material of the plastically flowable material and the particles or chopped fibers of the solder alloy.

In this case, advantages are obtained in the weight decrease of the connector and the increase of the effective soldering surface area contributing to the enhancement of the bonding strength by soldering between the connector and a printed circuit board.

What is claimed is:

1. An adjustable and readily solderable sheet-like connector which comprises:
    (a) a sheet-like body made of an electrically insulating elastic material,
    (b) a plurality of wires made of a plastically deformable soft metal or alloy susceptible to soldering provided as integrally bonded to the sheet-like body in a planar arrangement running substantially in parallel with each other, at least part of the surface of each of the wires being not embedded in the sheet-like body forming a set of parallel electroconductive paths on the surface of the sheet-like body, and
    (c) a soldering layer at least partly covering the surfaces of the wires at the portions not embedded in the sheet-like body which is made of a composite material composed of a matrix of a plastically flowable material and particles or chopped fibers of a solder alloy dispersed therein.

2. The adjustable and readily solderable sheet-like connector as claimed in claim 1 wherein the metal or alloy forming the wires has a Brinell hardness not exceeding 100 kg/mm$^2$.

3. The adjustable and readily solderable sheet-like connector as claimed in claim 1 wherein the particle size of the particles of the solder alloy dispersed in the soldering layer is in the range from 0.01 to 1 mm in diameter.

4. The adjustable and readily solderable sheet-like connector as claimed in claim 1 wherein the chopped fibers of the solder alloy have a diameter in the range from 0.01 to 0.1 mm, the ratio of the length to diameter of each of the chopped fibers being in the range from 3 to 10.

5. The adjustable and readily solderable sheet-like connector as claimed in claim 1 wherein the plastically flowable material forming the matrix of the soldering layer is a hot-melt adhesive.

6. The adjustable and readily solderable sheet-like connector as claimed in claim 1 wherein the melting temperature of the metal or alloy forming the wires is substantially higher than the soldering temperature of the particles or chopped fibers of the solder alloy dispersed in the soldering layer.

7. The adjustable and readily solderable sheet-like connector as claimed in claim 1 wherein each of the wires is embedded in the sheet-like body to about a half diameter depth.

8. The adjustable and readily solderable sheet-like connector as claimed in claim 1 wherein each of the wires is held as bonded to the bottom of a groove in the sheet-like body to be positioned below the surface level of the sheet-like body and each of the grooves is filled with the composite material composed of the plastically flowable material and the particles of the solder alloy.

9. The adjustable and readily solderable sheet-like connector as claimed in claim 1 wherein each of the wires is a hollow wire having a C-wise cross section opening upwardly and the space in the hollow wire is filled with the composite material composed of the plastically flowable material and the particles or chopped fibers of the solder alloy.

* * * * *